(12) United States Patent
Ihli et al.

(10) Patent No.: US 7,881,349 B2
(45) Date of Patent: Feb. 1, 2011

(54) EXTERNAL-CAVITY OPTICALLY-PUMPED SEMICONDUCTOR-LASER WITH A RESONATOR STOP

(75) Inventors: Christopher Ihli, Cupertino, CA (US);
Qi-Ze Shu, Cupertino, CA (US);
Andrea Caprara, Palo Alto, CA (US);
Juan L. Chilla, San Jose, CA (US)

(73) Assignee: Coherent, Inc., Santa Clara, CA (US)

( * ) Notice: Subject to any disclaimer, the term of this patent is extended or adjusted under 35 U.S.C. 154(b) by 171 days.

(21) Appl. No.: 12/021,652

(22) Filed: Jan. 29, 2008

(65) Prior Publication Data

US 2009/0190623 A1 Jul. 30, 2009

(51) Int. Cl.
*H01S 3/109* (2006.01)
*H01S 3/081* (2006.01)
*H01S 3/0941* (2006.01)

(52) U.S. Cl. ............................ 372/22; 372/105; 372/72
(58) Field of Classification Search ................... 372/22, 372/72, 105
See application file for complete search history.

(56) References Cited

U.S. PATENT DOCUMENTS 6,097,742 A 8/2000 Caprara et al. ................. 372/22

2002/0196819 A1* 12/2002 Spinelli et al. ................. 372/21
2005/0207457 A1* 9/2005 Agnesi et al. ................. 372/27

OTHER PUBLICATIONS

Jan. 2007 Brochure, entitled "Gradient Index (GRIN) Lenses," published by GRIN TECH, 2 pages in length.

* cited by examiner

*Primary Examiner*—Minsun Harvey
*Assistant Examiner*—Marcia A. Golub-Miller
(74) *Attorney, Agent, or Firm*—Morrison & Foerster LLP

(57) ABSTRACT

An optically pumped semiconductor-laser (OPS-laser) resonator includes an arrangement for delivering optical pump radiation on an OPS-chip to cause fundamental radiation to circulate in the resonator. The resonator includes second and third-harmonic generating crystals and is arranged deliver third-harmonic radiation. The resonator also includes a stop positioned and configured to stabilize the laser output. The pump radiation arrangement delivers the pump radiation at an angle to the resonator axis and includes wedged GRIN lens arranged such that the pump radiation forms a circular spot on the OPS chip. The third harmonic generating crystal acts as a polarizer for the fundamental radiation and angularly separates fundamental and third harmonic beams.

1 Claim, 6 Drawing Sheets

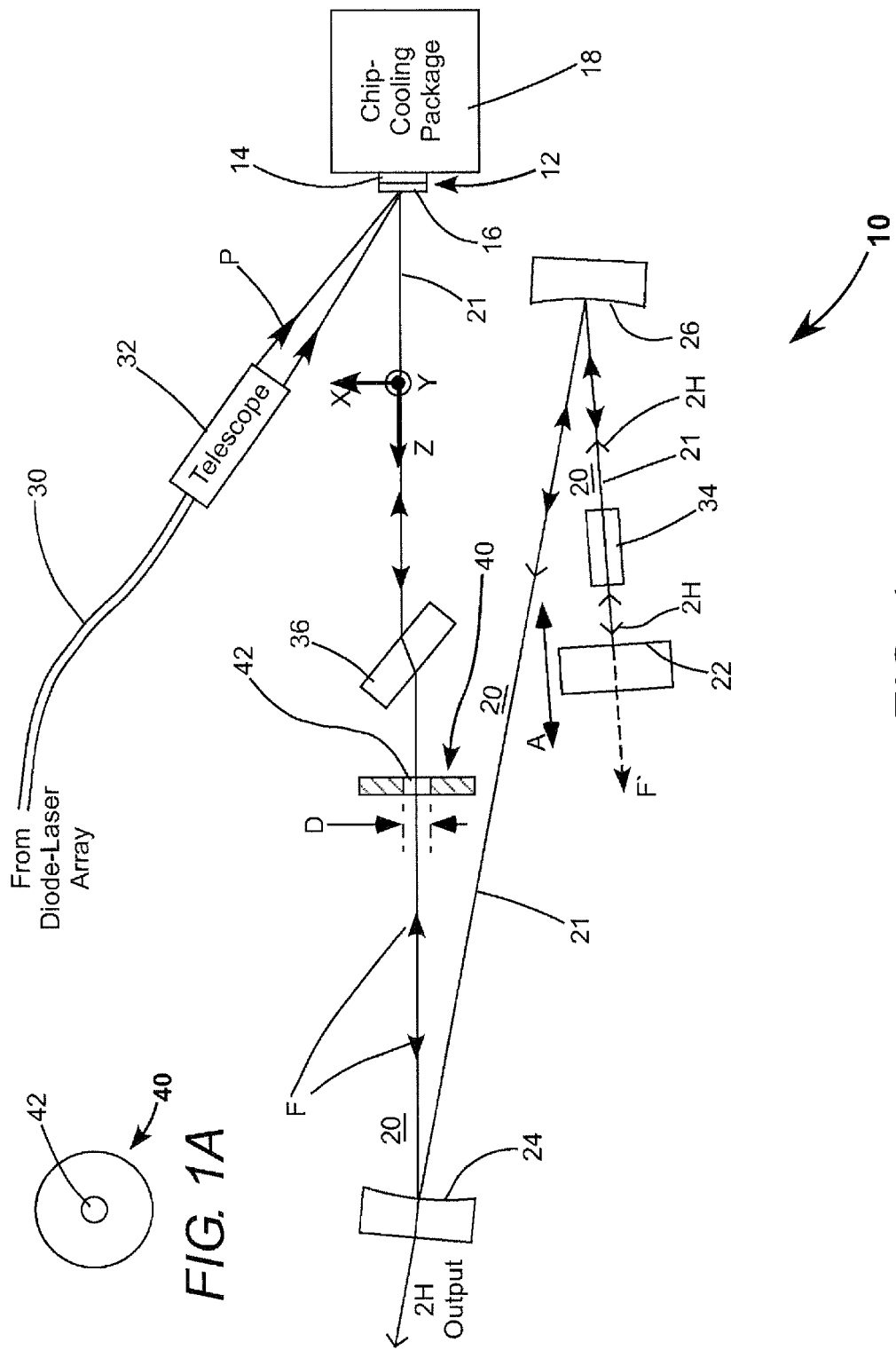

US 7,881,349 B2

EXTERNAL-CAVITY OPTICALLY-PUMPED SEMICONDUCTOR-LASER WITH A RESONATOR STOP

TECHNICAL FIELD OF THE INVENTION

The present invention relates in general to external cavity, surface-emitting, optically pumped semiconductor-lasers. The invention relates in particular to optimizing and stabilizing the output of such a laser.

DISCUSSION OF BACKGROUND ART

An external cavity, surface-emitting, optically pumped semiconductor-laser (hereinafter referred to as an OPS-laser) can provide a viable alternative to a diode-pumped solid-state laser (DPSS laser) in certain laser applications. This is particularly true when the laser is required to provide continuous-wave (CW) output. An intracavity frequency-multiplied OPS-laser pumped by radiation from a diode-laser array can provide several watts (W) of harmonic-wavelength output. Such OPS lasers are described in detail in U.S. Pat. No. 6,097,742, assigned to the assignee of the present invention, the complete disclosure of which is hereby incorporated by reference.

In a basic form, such a laser includes a laser-resonator having at one end thereof a structure referred to by practitioners of the art as an "OPS-chip". This chip includes a surface-emitting semiconductor gain-structure surmounting a mirror-structure. The mirror structure can be a multilayer semiconductor mirror, a multilayer dielectric mirror, or a dielectric layer enhanced metal mirror. The gain-structure comprises a plurality of active (quantum-well) layers periodically separated by spacer layers. The quantum-well layers provide very high optical-gain. The chip is mounted on a heat sink.

The composition of the active layers of the gain-structure determines the fundamental wavelength of the laser. The mirror-structure of the OPS-chip is made maximally reflective at the fundamental wavelength of the laser and usually provides one terminating mirror of the laser-resonator. The gain-structure is accordingly in the resonator. Either a mirror at an opposite end of the resonator or an intermediate mirror (if the resonator is folded thereby) can be made partially transparent to fundamental radiation, or maximally transparent to harmonic-wavelength radiation, for coupling output-radiation out of the resonator. Pump radiation (usually from a diode-laser array) is focused on the gain-structure from in front of the OPS-chip forming what is usually termed a "pump-spot" on the gain-structure Providing that the gain-structure of an-OPS laser is located at one end of the resonator coupled with the fact that the gain-structure, being spatially periodic, does not suffer from the phenomenon referred to as spatial hole-burning, makes it ideal for providing single-mode output ($TEM_{00}$). However, more power can be extracted from the laser if the resonator is slightly "detuned" to allow a few lateral modes to oscillate. This is typically accomplished by axially moving the opposite end mirror of the resonator to vary the length of the resonator, while monitoring the output power.

It has been found that variation of output power with varying resonator length is not always a smooth variation that permits accurate optimization. The variation is sometimes erratic and unstable which makes it difficult to determine if an optimum resonator length has been reached. It is believed, without being limited to a particular theory, that one reason for this is that as the mirror is moved, the nominal circulating beam position (mode-spot) on the gain structure can shift laterally and become misaligned with the pump-spot. Whatever the reason, it would be useful if such uncertain behavior could be minimized, if not altogether eliminated.

SUMMARY OF THE INVENTION

The present invention is directed to devices for facilitation optimization or stabilization of the output of an OPS-laser. In one aspect, an OPS-laser resonator arranged to provide output radiation at a predetermined wavelength, comprises a laser-resonator including an OPS-chip. The OPS-chip includes a mirror-structure surmounted by a semiconductor multilayer gain-structure. The resonator is formed by a plurality of mirrors, one of which is the mirror structure of the OPS-structure. An arrangement is provided for delivering optical pump-radiation to the OPS-chip such that radiation having a fundamental-wavelength of the gain-structure circulates in the laser when the optical pump radiation is delivered. A stop is positioned in the laser resonator and is configured to stabilize the laser output.

In another aspect of the invention, the pump-radiation delivery arrangement delivers the pump-radiation to the OPS-chip generally at an angle to the longitudinal axis of the laser resonator. The pumping arrangement includes optical elements configured such that the pump radiation forms an about circular spot on the OPS-structure.

In yet another aspect of the present invention, the laser-resonator includes a birefringent filter located in the laser resonator and arranged to select the fundamental wavelength from the gain-bandwidth of the gain-structure. A first birefringent, optically nonlinear crystal is located in the laser resonator and arranged to generate second-harmonic wavelength radiation from the fundamental wavelength radiation. A second birefringent optically nonlinear crystal is located in the laser resonator and is arranged to generate third-harmonic wavelength radiation from the fundamental wavelength radiation and the second-harmonic radiation. The second optically nonlinear crystal has a longitudinal axis and has entrance and exit faces thereof non-orthogonally inclined to the longitudinal axis thereof such that the second optically nonlinear crystal has a truncated prismatic form. This prismatic form causes the second optically nonlinear crystal to function as a polarizer for the fundamental-wavelength radiation, and thereby minimizes interaction of the birefringence of the first optically nonlinear crystal with that of the birefringent filter.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 1 schematically illustrates a preferred embodiment of an OPS-laser in accordance with the present invention, including a folded laser-resonator having an optically nonlinear crystal therein for converting fundamental radiation of the laser resonator to second-harmonic radiation, the second-harmonic radiation being delivered as output radiation, and the laser resonator having aperture stop therein for stabilizing the output-power.

FIG. 1A schematically illustrates detail of the aperture stop of FIG. 1.

DETAILED DESCRIPTION OF THE INVENTION

Figure 1B:
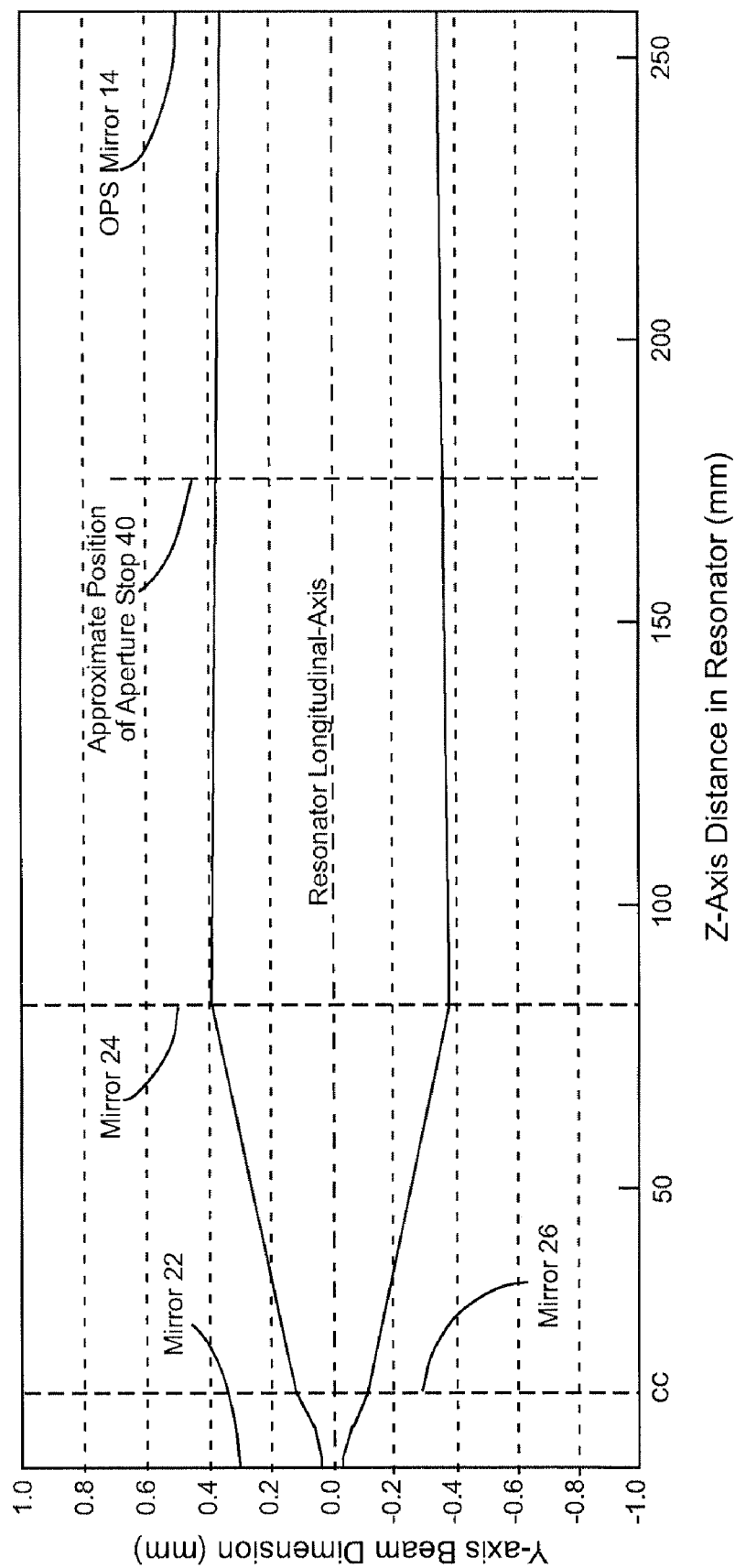
FIG. 1B is a graph schematically illustrating beam diameter or mode-size as a function of end mirror position in an example of the laser-resonator of FIG. 1.

Referring now to the drawings, wherein like components are designated by like reference numerals, FIG. 1 schematically illustrates a preferred embodiment of an OPS-laser in accordance with the present invention. Laser 10 is based on an OPS-chip 12 including a mirror structure 14 surmounted by a multilayer semiconductor gain structure 16. The OPS-chip is bonded in thermal contact with a cooling package 18.

A laser-resonator 20 is terminated at one end thereof by mirror structure 14 of the OPS-chip and at an opposite end thereof by a plane mirror 22. The resonator is folded by concave mirrors 24 and 26. An optical fiber or a fiber bundle 30 transports pump-radiation from a diode-laser array to a telescope 32. Telescope 32 projects the pump-radiation, as indicated by arrows P, to form a pump-radiation spot (pump-spot) on gain-structure 16 of the OPS chip. This causes fundamental radiation to circulate along folded longitudinal axis 21 of the laser resonator as indicated by arrow F.

A birefringent filter 36 is arranged to select a fundamental wavelength from the gain-bandwidth of gain-structure 16. A birefringent, optically nonlinear crystal 34 is located between fold-mirror 24 and end-mirror 22. Crystal 34 is arranged to convert the circulating fundamental radiation into second-harmonic radiation indicated by arrows 2H. Mirror 24 is highly reflective at the wavelength of the fundamental radiation but highly transmissive at the second-harmonic (2H) wavelength. Accordingly, the 2H-radiation is delivered from resonator 20, via mirror 24, as output radiation. If the laser is used to deliver fundamental radiation, i.e., does not include crystal 34, the fundamental radiation is preferably delivered via mirror 22. In this case, mirror 22 would be made partially transmitting at the fundamental wavelength.

Those skilled in the art will be aware that laser radiation circulates in a laser resonator as a beam having a finite cross-section dimension (mode-size) that varies along the length of the resonator, not necessarily monotonically. The size and variation is determined, inter alia, by the axial length of the resonator and the spacing and curvature of the resonator end mirrors and any fold mirrors. The mode-size on the OPS-chip is often termed the mode-spot by practitioners of the art. The size of the mode-spot on the chip can be adjusted by adjusting the length of the location of end-mirror 22, as indicated by arrows A, thereby adjusting the circulating fundamental power and accordingly the 2H output power of laser 10. Resonator mode-sizes as a function of length can be computed using commercially available optical design software.

In resonator 20, an aperture stop 40 having an aperture 42 therein is located close to birefringent filter 36. One preferred example of aperture stop 40 is depicted in cross-section in FIG. 1. Further detail of the aperture stop is depicted in FIG. 1A. The aperture circular in this particular resonator configuration, is preferably nominally centered on the resonator axis and preferably has a diameter D between about 1.0 mm and 1.6 mm that is between about 1.2 and 2.0 times the calculated $TEM_{00}$ mode-size at the location of the resonator. A diameter of 1.4 mm (about 1.7 times the $TEM_{00}$ mode-size) has been found suitable for an aperture located as indicated in FIG. 1.

Placing such an aperture, thus configured, in the resonator has been found to smooth the variation in output power as a function of resonator length, thereby facilitating optimization of the output-power of the laser. It has also been found to provide increased temporal stability of the laser output once the output has been optimized. A description of one experiment to test the effectiveness of the aperture in this regard, in one example of laser 10, is set forth below with reference to FIG. 1B, FIG. 2, and FIG. 3.

It should be noted that a circular aperture is not the only aperture form that can be effective. In preliminary experiments a simple knife-edge stop or a stop created by two knife-edges perpendicular to each other were found to be effective. Those skilled in the art may use other forms of aperture stop without departing from the spirit and scope of the present invention.

Figure 3:
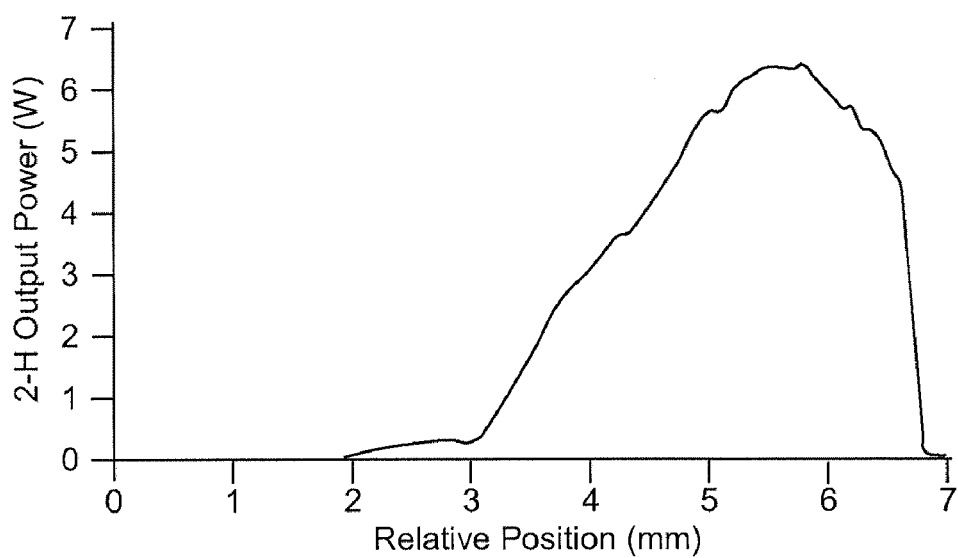
FIG. 3 is a graph schematically illustrating second-harmonic output power as a function of resonator-length variation for the example of the laser of FIG. 1 with the aperture stop included.

In the experimental example of FIG. 3, resonator 20 has a total length of about 257.0 mm Mirror 24 has a radius of curvature of about 169.0 mm and is axially located about 175.0 mm from OPS-chip 16. Birefringent filter 36 is located about 58.0 mm from the OPS-chip. The circulating fundamental wavelength is 1064 nanometers (nm). Mirror 24 has a radius of curvature of about 35.0 mm and is axially located about 69.0 mm from mirror 24. Mirror 22 is a plane mirror located between about 11.0 mm and 17.0 mm from mirror 26, with this distance being variable for optimization purposes. Optically nonlinear crystal 34 is a crystal of lithium borate (LBO) arranged for type-I frequency-doubling. The resonator configuration is selected, here, for a relative insensitivity to changes or variations in shape of the OPS chip, among other criteria. Aperture stop 40 is located in a region or space of the resonator where the mode size is relatively large compared with other regions thereof, and in which the mode-size varies with length in a relatively shallow slope. This makes it easier to accurately size aperture 42, and minimizes the criticality of the placement of the aperture.

The pump-spot and mode-spot radii on OPS-chip 12 are estimated at 240.0 micrometers (µm) and 350.0 µm, respectively. Aperture stop 40 is located about 25.0 mm from birefringent filter 36, and aperture 42 in the stop has a diameter of 1.4 mm. The $TEM_{00}$ mode-radius at the aperture is estimated at 355.0 µm (0.355 mm). The mode-radius radius in crystal 34 is estimated at 50.0 µm. The pump-spot radius is estimated at 240.0 µm, with about 30.0 Watts (W) of pump radiation being delivered into the pump-spot. The fundamental wavelength of 1064 nm provides for a 2H wavelength of 532 nm. The computed $TEM_{00}$ mode-diameter as a function of position in the resonator is depicted in the graph of FIG. 1B.

Figure 2:
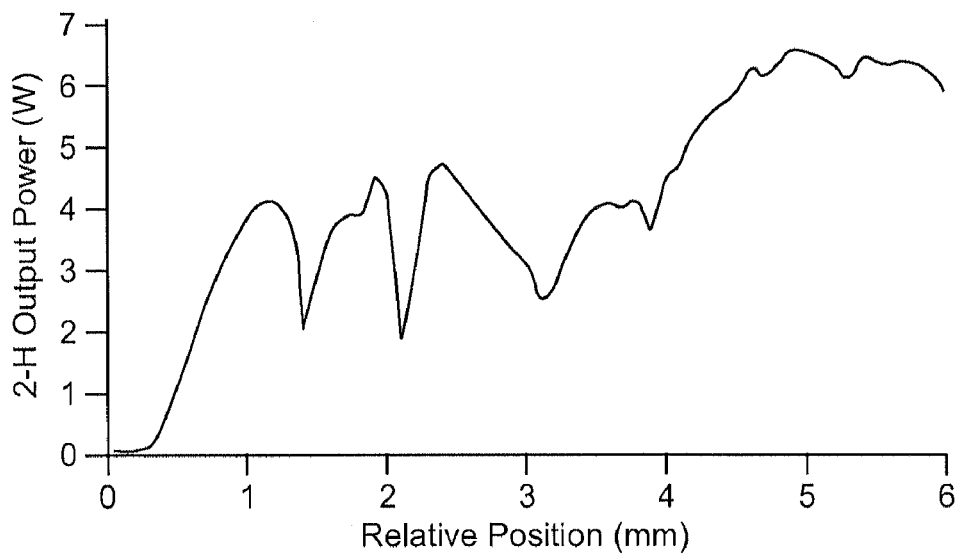
FIG. 2 is a graph schematically illustrating second-harmonic output power as a function of resonator-length variation for an example of the laser of FIG. 1 with the aperture stop omitted.

FIG. 2 is a graph schematically illustrating measured 2H output as a function of the incremental increase of the distance (position) of mirror 22 relative to mirror 26 from a nominal minimum separation of 11.0 mm, without aperture stop 40 in the resonator. It can be seen that over the first 4 mm of adjustment, the output fluctuates substantially and erratically through regions of instability. In the range from zero to about 1.5 mm the output is $TEM_{00}$. In the range from about 1.5 mm to about 6.0 mm there is multiple-lateral-mode output reaching a peak output-power at relative increments between about 5.0 mm and 6.0 mm. The steep dips in power are believed to be due to degenerative interaction of high order lateral modes having the same frequency FIG. 3 is a graph schematically illustrating measured 2H output as a function of the incremental increase of the distance (position) of mirror 22 relative to mirror 26, with aperture stop 40 in the resonator. It can be seen that the output-power increases smoothly and stably, beginning at about 3.0 mm separation and reaching a peak output-power at relative increments between about 5.5 mm and 6.5 mm. In the range between about 3.0 mm and 5.0 mm the output is $TEM_{00}$, with multiple-lateral-mode output at increasing incremental distances.

It should be noted here that erratic output similar to that of FIG. 2 was observed when the optically nonlinear crystal was omitted and fundamental output measured. The problem was corrected with the aperture included.

The present invention is described above in the context of a particular OPS-laser resonator configuration arranged to deliver second-harmonic radiation at a particular wavelength. The application, however, is applicable to any OPS-laser resonator including a resonator terminated at each end thereof by conventional mirrors and folded by the mirror-structure of an OPS-chip. The resonator may be configured to deliver either fundamental or frequency-converted radiation. Frequency converted radiation may be second or higher-harmonic radiation generated by frequency-multiplication in one or more optically nonlinear crystals and having a wavelength shorter than the fundamental wavelength.

Figure 4:
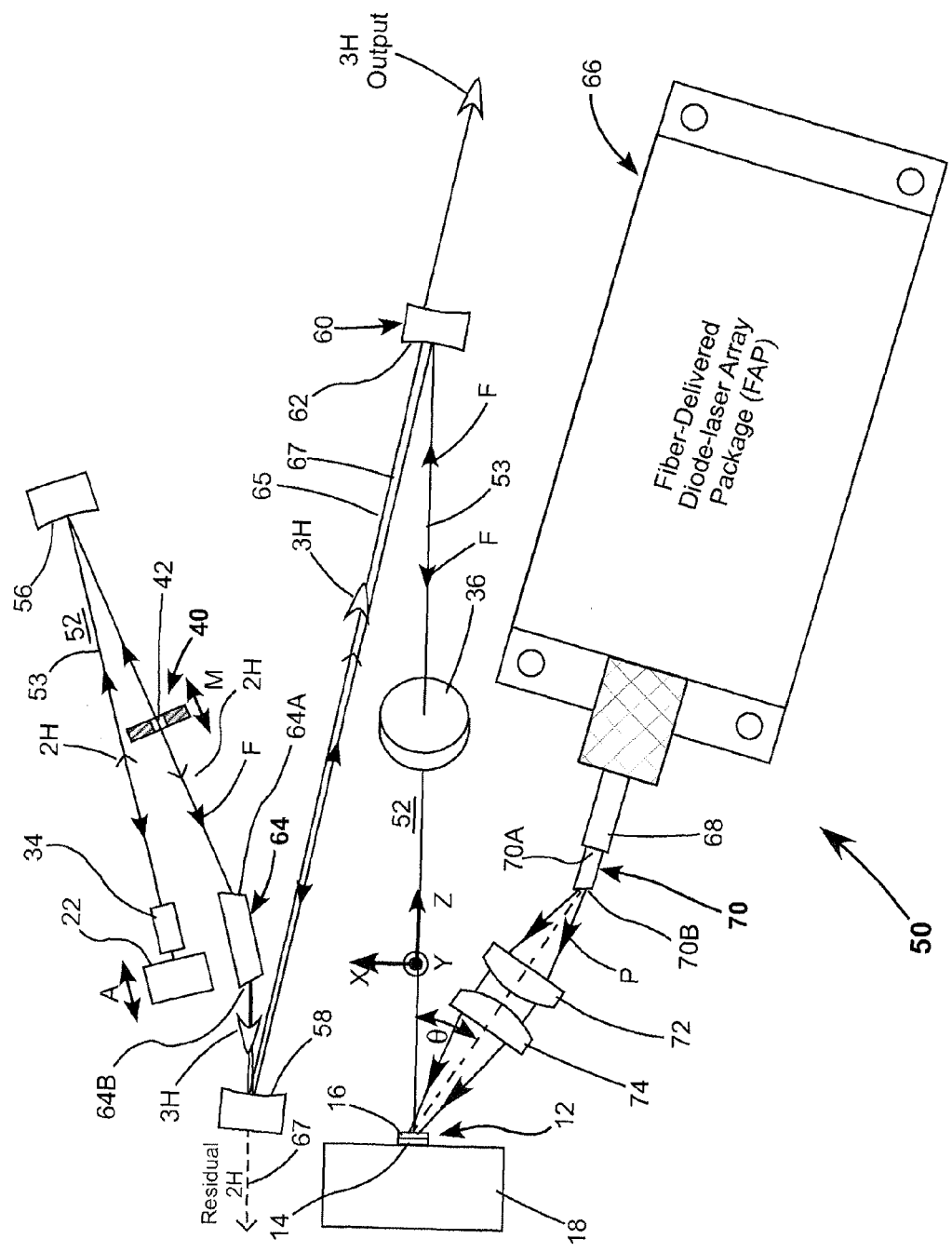
FIG. 4 schematically illustrates another embodiment an OPS-laser in accordance with the present invention, including a folded laser-resonator having a first optically nonlinear crystal therein for converting fundamental radiation of the laser resonator to second-harmonic radiation, and a second optically nonlinear crystal therein for mixing the fundamental and second-harmonic radiations to provide third-harmonic radiation, the third-harmonic radiation being delivered as output radiation, and the laser resonator having aperture stop therein for stabilizing the output-power of the third-harmonic radiation.

By way of example, FIG. 4 schematically illustrates another embodiment 50 of an OPS-laser in accordance with the present invention arranged to generate third-harmonic (3H) radiation by sum-frequency mixing fundamental and 2H radiation. Laser 50 includes a resonator 52 formed between mirror-structure 14 of an OPS-chip 12 and a plane mirror 22 axially movable as indicated by arrows A. The OPS structure is in thermal communication with a cooling package 18. Gain-structure 16 of the OPS-chip is optically pumped by pump light P delivered by a diode-laser array package 66 via an optical fiber bundle 68, a gradient-index (GRIN) lens 70 having an entrance face 70A, butt coupled to the optical fiber, and an exit face 70B, and plano-convex lens-elements 72 and 74. This pump-radiation delivery arrangement is discussed in detail further hereinbelow. In response to the optical pumping, fundamental radiation circulates in resonator 52, along the longitudinal axis 53 of the resonator, as indicated in FIG. 4 by arrows F.

Resonator 50 is folded by concave mirrors 56 and 58 and a mirrored concave surface 62 of a biconcave lens 60. A birefringent filter 36 is located in resonator 52 between lens 60 and the OPS-chip for fixing a fundamental wavelength in the gain-bandwidth of the OPS-structure. An optically nonlinear crystal 34 converts fundamental-wavelength radiation to second-harmonic (2H) radiation in a double pass of the fundamental-wavelength radiation through crystal 34. Fundamental-wavelength radiation and 2H-radiation are then converted to third-harmonic (3H) radiation by a birefringent, optically nonlinear crystal 64 having entrance and exit faces 64A and 64B, respectively.

Faces 64A and 64B are at an angle to a direction perpendicular to the longitudinal axis of the crystal such that the crystal in effect is a truncated prism. The angle of face 64A is selected to minimize the walk off angle between the fundamental-wavelength and 3H-radiations. The angle of face 64B cooperative with refractive-index dispersion in the crystal causes the 3H-radiation to emerge at an angle to the fundamental-wavelength radiation and to follow a path 65 laterally displaced from that of the fundamental radiation, i.e., laterally displaced from the longitudinal axis of the resonator between mirrors 58 and 62. Accordingly the 3H-radiation is incident on mirror 62 at a different location from that on which the fundamental-wavelength radiation is incident. Mirror 58 is highly reflective for fundamental and 3H-radiation and highly transmissive for 2H-radiation allowing 2H-radiation residual from the 3H-generstion to exit the resonator via mirror 58, as indicated by dotted-line 67. Mirror 62 is maximally reflective for fundamental-wavelength radiation and maximally transmissive for 3H-radiation. This allows the 3H-radition to be delivered as output via mirror 62.

An important aspect of the truncated-prism form of crystal 64 is that the crystal functions as a hard polarizer for fundamental-wavelength radiation. This is because the configuration of the crystal creates an angular separation of orthogonally opposed polarization states of the fundamental-wavelength radiation entering and leaving crystal 64, with only the required state circulating in the resonator. It is believed without being limited to a particular theory that this minimizes interaction of the birefringence of birefringent filter 36 and the birefringence of 2H-generating crystal 34, which interaction could compromise the wavelength selecting function of BRF 36 and cause instability in the laser output. Were the crystal configured differently, a separate polarizing arrangement, such as a plurality of Brewster plates, could be provided at the expense of added cost and complexity of alignment.

Aperture stop 40 is located between crystal 64 and mirror 56 in a space where the diameter of the circulating fundamental beam is changing steeply as a function of position in the resonator. This can be seen in FIG. 4A, which schematically depicts the beam-height (beam-radius) as a function of position in the resonator. By making aperture 40 axially movable, as indicated in FIG. 4 by arrows M, the diameter of aperture 42 relative to the beam diameter can be varied to optimize the effect of the aperture, by creating in effect an aperture which has dimension that is variable with respect to the $TEM_{00}$ mode-size.

Figure 4A:
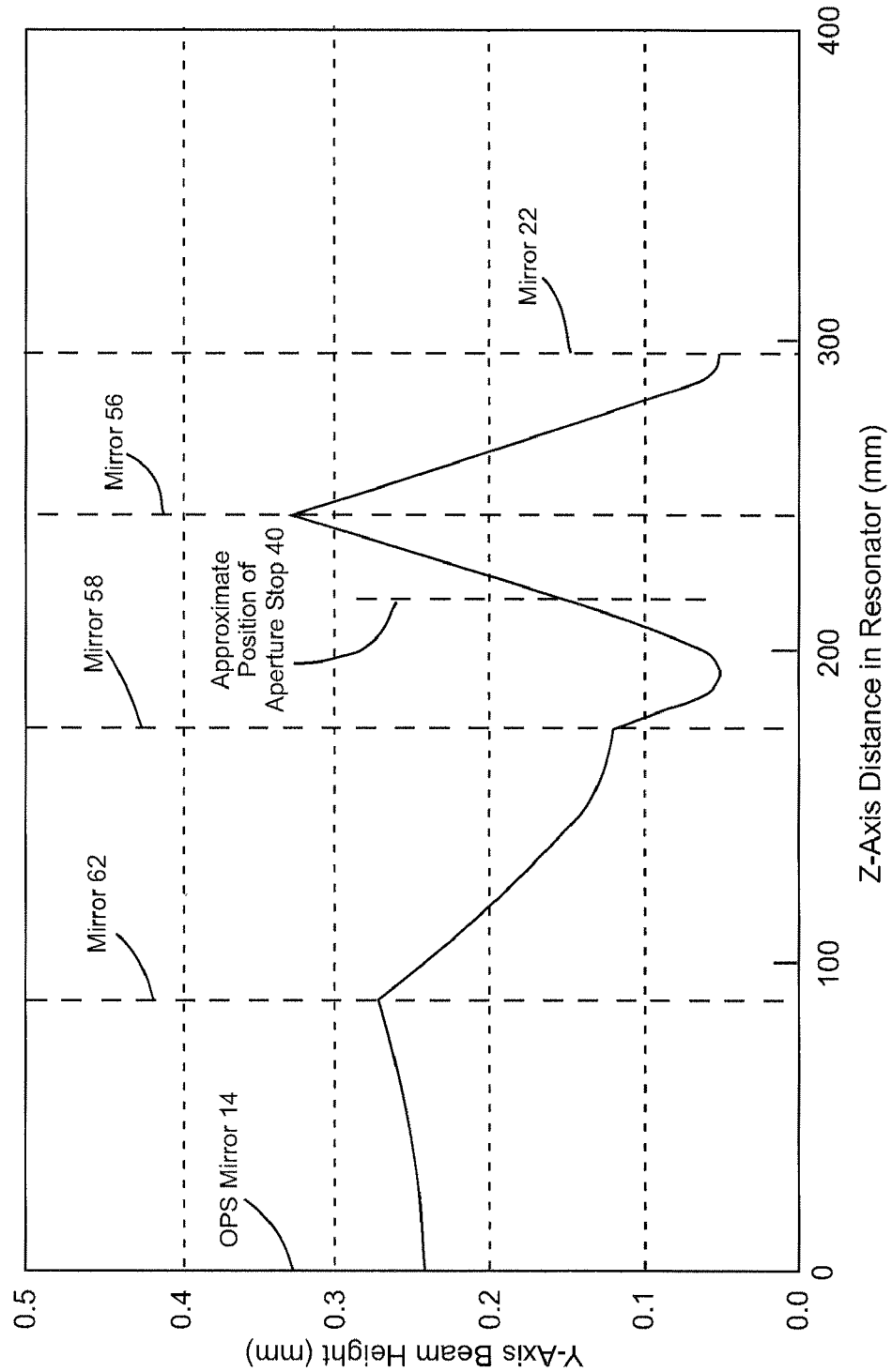

In one example of laser 50: mirror 22 is a plane mirror; mirror 56 has a concave radius of curvature of 50.0 mm; mirror 58 has a concave radius of curvature of 39.0 mm; and mirror 62 has a concave radius of curvature of 170.0 mm. Spacing of the components is as indicated in FIG. 4A. The fundamental wavelength is 1064 nm and the 3H-wavelength is about 355 nm.

Returning now to a discussion of the truncated-prismatic configuration of crystal 64, a particular reason for causing the fundamental-wavelength radiation and 3H radiation to be incident at separate locations on mirror 62 is as follows. If the 3H-radiation has a wavelength in the ultraviolet (UV) region of the spectrum, as would be the case for fundamental-wavelength radiation having a wavelength of 1064 nm, and also has a relatively high power, for example about 1.0 W or greater, the 3H-radiation can gradually degrade optical coatings that are used to provide the reflection and transmission characteristics of the mirror. Were the fundamental-wavelength and 3H-radiations incident at the same location on the mirror, the degradation due to the UV would cause losses in resonator 52 and reduce the power of the fundamental-wavelength radiation.

If the 3H-radiation is incident on a separate location off the resonator axis as depicted in FIG. 4, degradation can still occur on the mirror but will not occur on the resonator axis. This will of course reduce the UV output, but not to the same extent as would a drop in fundamental-wavelength power. Further, if the UV degradation becomes problematic, the mirror, held in a suitable mirror mount (not shown), can be rotated about the resonator axis to move a clean portion of the mirror into the path of the UV radiation while maintaining alignment of the resonator.

Figure 5:
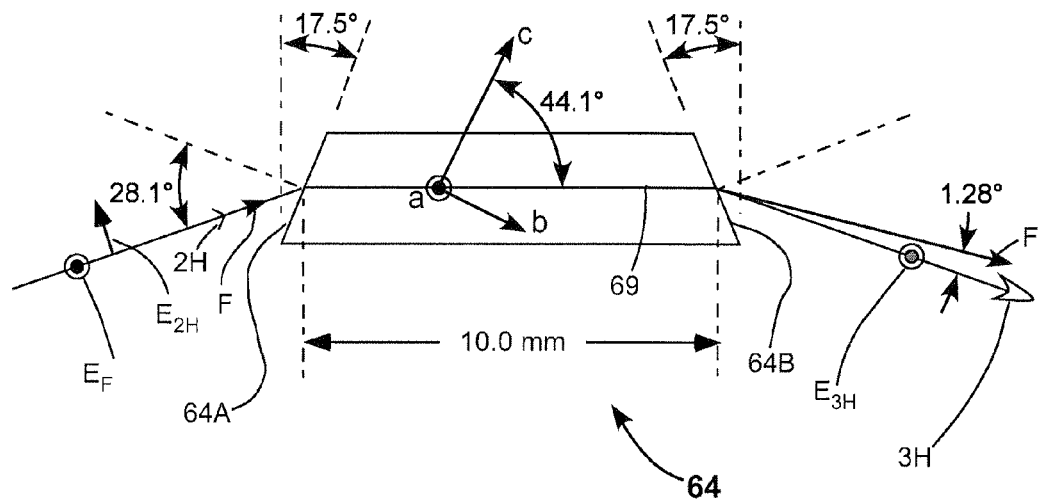
FIG. 5 schematically illustrates one example of the second optically nonlinear crystal in the OPS-laser of FIG. 4.

FIG. 5 schematically illustrates one example of a prismatic-cut optically nonlinear crystal 64 suitable for use on the above-specified example of laser 50. Here, crystal 64 is assumed to be a crystal of lithium borate (LBO). The crystal is configured for type-II phase matching and is cut with the c-axis of the crystal at 44.1° to the longitudinal axis of the crystal. The a-axis of the crystal is perpendicular to the longitudinal axis and the b-axis is perpendicular to the c-axis. Faces 64A and 64B are at an angle of 17.5° to a direction perpendicular to the longitudinal axis of the crystal, with the faces inclined toward each other. Fundamental and 2H-radiations enter the crystal collinearly at an incidence angle of 28.1° on face 64A thereof. The polarization orientations of the fundamental-wavelength and 2H radiations are indicated by arrowhead $E_F$ and arrow $E_{2H}$ respectively. The polarization orientation of the 3H-radiation is indicated by arrowhead $E_{3H}$. There is an angle of about 1.28° between the fundamental-wavelength radiation and 3H-radiation exiting the crystal. In the above specified example of laser 50, the centers of the incidence locations of the fundamental-wavelength and 3H-radiations on mirror 58 would be separated by about 0.22 mm which is about a beam diameter of the fundamental and 3-H on the mirror. The incidence locations of the fundamental-wavelength and 3H-radiations on mirror 62 would be separated by about 1.0 mm which is about twice a beam diameter of the fundamental and 3-H on the mirror.

Figure 6:
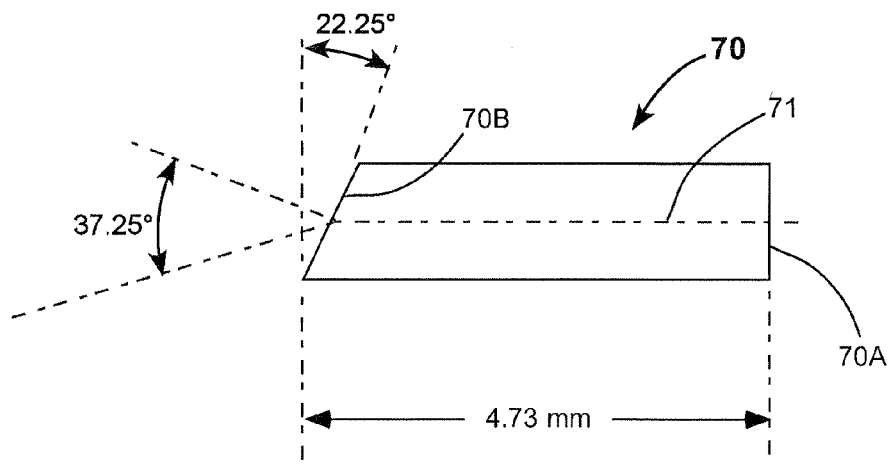
FIG. 6 schematically illustrates one example of an optical pumping arrangement for the OPS-laser of FIG. 4.

Referring again to FIG. 4 and, in addition, to FIG. 6, it is desirable to match the sizes of a pumping-radiation beam (pump-spot) and the fundamental mode size on gain-structure 16 of OPS-structure 12. The fundamental mode spot on the OPS-structure is essentially circular in cross-section. If pump-radiation is directed onto the OPS-structure at an angle θ to the longitudinal axis of resonator 52, absent any measure to the contrary the pump-spot will be elliptical in cross-section being longer in the X-axis than in the Y-axis. In laser 50, this is remedied by cutting exit face 70B of grin lens 70 at an angle to the longitudinal axis 71 of the lens (see FIG. 6).

In the example of laser 50 specified above, GRIN lens 70 is a SELFOC™ Part Number SLW-1.8-0.25β-830, from NSG America Inc. of Somerset, N.J. The lens has a length of about 4.73 mm and a diameter of 1.8 mm. Exit face 70B is polished at an angle of about 22.25° to longitudinal axis 71 of the lens. Radiation exits face 70B at an angle of about 37.25° to a normal to the face. The radiation is directed along the longitudinal axis of focusing elements 72 and 74. The focusing lens-elements are made from BK7 glass, and each have a convex radius of curvature of 7.781 mm, an axial thickness of 3.8 mm, and a diameter of 10.0 mm. Axial spacing between the GRIN lens and focusing element 72 is about 10.61 mm, axial spacing between the focusing element 72 and focusing element 74 is about 1.94 mm, and axial spacing between focusing element 74 and OPS-chip 12 is about 15.8 mm. The angle θ between the resonator axis and the longitudinal axis of the focusing elements is about 33°.

In the preferred embodiment, a quarter pitch GRIN lens is used to transform the input field into its far field at the exit face. This is convenient since the far field of fiber coupled diode package is close to Gaussian, that is, close to ideal for pumping. A quarter pitch GRIN creates on its outer face an image of an object located at infinity, i.e. an image of the angular distribution of the light impinging its input face. When a quarter pitch GRIN is placed in direct contact with fiber bundle 68, the spatial power distribution at the output face is the same for all fibers, as light coming out of each of them has the same angular distribution regardless of its position within the bundle. This single lobed power distribution can then be conveniently imaged to create a pump spot.

It should be noted above that while the present invention is described above in terms of OPS-lasers in which fundamental wavelength radiation is converted to a shorter wavelength by harmonic conversion in one or more intra-resonator optically nonlinear crystals the invention is equally applicable to an OPS-resonator delivering fundamental-wavelength radiation or delivering frequency-converted radiation that has a wavelength longer than the fundamental wavelength, generated by optical parametric frequency-division in an optically nonlinear crystal. While the aperture in the above-described embodiment is preferably a circular aperture, this should not be construed as limiting the aperture to a circular cross-section.

In summary, the present invention is not limited to the particular preferred embodiments and examples thereof described in detail herein. Rather, the invention is limited only by the claims appended hereto.

What is claimed is:

1. An OPS-laser, comprising:
   an OPS-laser resonator having a longitudinal axis and including an OPS-chip, the OPS-chip including a mirror-structure surmounted by a semiconductor multilayer gain-structure, the resonator being formed by a plurality of mirrors, one of which is the mirror structure of the OPS-structure;
   an arrangement for delivering optical pump radiation to the OPS-chip such that radiation having a fundamental-wavelength of the gain-structure circulates in the laser when the optical pump radiation is delivered;
   a birefringent filter located in the laser resonator and arranged to select the fundamental wavelength from the gain-bandwidth of the gain-structure;
   a first birefringent, optically nonlinear crystal located in the laser resonator and arranged to generate second-harmonic wavelength radiation from the fundamental wavelength radiation;
   a second birefringent optically nonlinear crystal arranged to generate third-harmonic wavelength radiation from the fundamental wavelength radiation and the second-harmonic radiation; and
   wherein the second optically nonlinear crystal has a longitudinal axis and has entrance and exit faces thereof non-orthogonally inclined to the longitudinal axis thereof and wherein said entrance and exit faces are tilted in opposite directions with respect to the longitudinal axis such that the second optically nonlinear crystal has a truncated prismatic form, which causes the second optically nonlinear crystal to function as a polarizer for the fundamental-wavelength radiation, thereby minimizing interaction of the birefringence of the first optically nonlinear crystal with that of the birefringent filter and wherein the laser resonator is terminated by the mirror-structure of the OPS structure and an end-mirror and is folded by first, second and third fold-mirrors, the first optically nonlinear crystal being located between the first fold-mirror and the end-mirror, the second optically nonlinear crystal being located between the first fold-mirror and the second fold-mirror, the third-harmonic output radiation being output via the third fold-mirror and wherein the non-orthogonal inclination of the exit face of the truncated-prismatic second optically nonlinear crystal causes angular separation of the fundamental and third-harmonic radiations sufficient that centers of incidence locations of fundamental and third-harmonic radiations on the second and third fold mirrors are spaced apart by at least one beam-width of the fundamental and third-harmonic radiations.

* * * * *